(12) United States Patent
Hayashi (10) Patent No.: US 8,227,152 B2
(45) Date of Patent: Jul. 24, 2012

(54) REFLECTIVE MASK BLANK FOR EUV LITHOGRAPHY

(75) Inventor: Kazuyuki Hayashi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/093,968

(22) Filed: Apr. 26, 2011

(65) Prior Publication Data

US 2011/0200920 A1 Aug. 18, 2011

Related U.S. Application Data

(63) Continuation of application No. PCT/JP2009/068519, filed on Oct. 28, 2009.

(30) Foreign Application Priority Data

Oct. 30, 2008 (JP) ................................. 2008-279899

(51) Int. Cl.
*G03F 1/22* (2012.01)
*G03F 1/24* (2012.01)

(52) U.S. Cl. .......................................................... 430/5

(58) Field of Classification Search .............. 430/5, 394; 428/428, 430; 378/35
See application file for complete search history.

(56) References Cited

U.S. PATENT DOCUMENTS

| | | | |
|---|---|---|---|
| 7,713,666 B2 | 5/2010 | Hayashi et al. | |
| 7,718,324 B2 | 5/2010 | Hayashi et al. | |
| 7,736,821 B2 | 6/2010 | Hayashi et al. | |
| 7,833,682 B2 | 11/2010 | Hayashi et al. | |
| 7,855,036 B2 | 12/2010 | Hayashi et al. | |
| 7,906,259 B2 | 3/2011 | Hayashi et al. | |
| 8,029,950 B2 * | 10/2011 | Hayashi et al. | ................... 430/5 |
| 2006/0251973 A1 | 11/2006 | Takaki et al. | |
| 2009/0253055 A1 | 10/2009 | Hayashi et al. | |
| 2010/0035165 A1 | 2/2010 | Hayashi et al. | |

(Continued)

FOREIGN PATENT DOCUMENTS

JP 2004-6798 1/2004

(Continued)

OTHER PUBLICATIONS

U.S. Appl. No. 13/070,728, filed Mar. 24, 2011, Hayashi.

(Continued)

*Primary Examiner* — Stephen Rosasco
(74) *Attorney, Agent, or Firm* — Oblon, Spivak, McClelland, Maier & Neustadt, L.L.P.

(57) ABSTRACT

A reflective mask blank for EUV lithography having a low-reflective layer which has a low reflectivity with respect to wavelengths of EUV light and a mask pattern inspection light and which satisfies a predetermined reflectivity (405 nm: <40%, 600 to 650 nm: 30 to 50%, 800 to 900 nm: >50%, 1,000 to 1,200 nm: <90%) in a wavelength region (400 to 1,200 nm) required for the mask production process and the pattern transcription process. A reflective mask blank for EUV lithography having a reflective layer for reflecting EUV light, an absorbing layer for absorbing EUV light and a low-reflective layer with respect to a mask pattern inspection light (wavelength: 190 to 260 nm), which are formed in this order on a substrate, wherein the low-reflective layer contains at least tantalum (Ta), oxygen (O) and hydrogen (H), and the low-reflective layer has a Ta+O total content that is between 85 and 99.9 at % and an H content that is between 0.1 and 15 at %.

32 Claims, 1 Drawing Sheet

U.S. PATENT DOCUMENTS

2010/0304283 A1    12/2010    Hayashi et al.
2011/0070534 A1    3/2011     Hayashi
2011/0104595 A1    5/2011     Hayashi et al.

FOREIGN PATENT DOCUMENTS

| | | |
|---|---|---|
| JP | 2006-228767 | 8/2006 |
| JP | 2009-21582 | 1/2009 |
| WO | 2008/084680 | 7/2008 |
| WO | 2008/093534 | 8/2008 |
| WO | 2009/116348 | 9/2009 |
| WO | 2010/007955 | 1/2010 |

OTHER PUBLICATIONS

International Search Report issued Feb. 2, 2010 in PCT/JP09/068519 filed Jan. 26, 2010.

* cited by examiner

REFLECTIVE MASK BLANK FOR EUV LITHOGRAPHY

TECHNICAL FIELD

The present invention relates to a reflective mask blank for EUV (extreme ultraviolet) lithography used for producing a semiconductor or the like (in this description, it is referred to as "EUV mask blank").

BACKGROUND ART

In the semiconductor industry, a photolithography method using visible light or ultraviolet light has been employed as a technique of transcribing a fine pattern on a Si substrate or the like, which is required for forming an integrated circuit having such fine pattern. However, the microsizing of semiconductor devices has been accelerated, and on the other hand, the conventional photolithography method approaches the limit. In the photolithography method, it is said that the resolution limit for a pattern is about ½ of exposure wavelength and is about ¼ of exposure wavelength even if an immersion method is used. Even though the immersion method with an ArF laser (193 nm) is used, it is estimated that the limit is about 45 nm. Now, as a new technique of light exposure using a wavelength of 45 nm or shorter, EUV lithography which is an exposure technique using EUV light having a further shorter wavelength than ArF laser has been considered to be promising as an exposure technique for 45 nm or below. In this description, the EUV light indicates a ray having a wavelength in a soft X-ray region or a vacuum ultraviolet ray region, specifically, a ray having a wavelength of about 10 to 20 nm, particularly about 13.5 nm±0.3 nm.

The EUV light is apt to be absorbed by any substance and the refractive indices of the substance with respect to this wavelength is close to 1, and therefore, the conventional dioptric system such as the photolithography using visible light or ultraviolet light cannot be employed. For this reason, a catoptric system, i.e. a reflective photomask and a mirror are employed in the EUV light lithography.

A mask blank is a laminated member before patterning which is used for producing a photomask. The EUV mask blank has a reflective layer for reflecting EUV light and an absorbing layer for absorbing EUV light which are formed in this order on a substrate such as glass or the like. For the reflective layer, normally used is a multilayered reflective film which is formed by laminating alternately a layer of high refractive index and a layer of low refractive index whereby the reflectance of light is increased when EUV light is irradiated to the layer surface. As the absorbing layer, a material having a high absorbing coefficient to EUV light, specifically, a material having Ta or Cr as major component, is used.

On the absorbing layer of the EUV mask blank, a low-reflective layer with respect to a mask pattern inspection light is normally formed. In order to detect the presence or absence of a defect of pattern after the formation of a mask pattern, a ray which has the wavelength region of deep ultraviolet light (190 to 260 nm) is employed. The inspection of pattern employing the ray having the above-mentioned wavelength region is to detect the difference of reflectivity between an area where the low-reflective layer and the absorbing layer have been removed by a patterning process and an area where the low-reflective layer and the absorbing layer remain, namely, to detect the contrast of reflection light at the surfaces of these areas whereby the presence or absence of the defect of pattern is examined. In order to increase the sensitivity of the detection of mask pattern, the contrast should be increased. For this purpose, it is normally required that the low-reflective layer has a low reflectivity with respect to the above-mentioned wavelength region, namely, the reflectivity with respect to the wavelength region is 15% or less.

Patent Document 1 describes that a low-reflective layer comprising an oxide of tantalum-boron alloy (TaBO) or an oxynitride of tantalum-boron alloy (TaBNO), which is formed on an absorbing layer comprising a nitride of tantalum-boron alloy (TaBN), has preferably a low reflectivity with respect to the wavelength region (190 nm to 260 nm) of mask pattern inspection light.

Patent Document 2 describes that it is preferred to form a low-reflective layer comprising metal, silicon (Si), oxygen (O) and nitrogen (N) on an absorbing layer in order to adjust the reflectivity with respect to the wavelength region (190 nm to 260 nm) of mask pattern inspection light.

PRIOR ART DOCUMENTS

Patent Documents

Patent Document 1: JP-A-2004-6798 (U.S. Pat. No. 7,390,596)

Patent Document 2: JP-A-2006-228767

DISCLOSURE OF INVENTION

Technical Problem

Patent Document 1 and Patent Document 2 state that when a low-reflective layer is made of the TaBO film, the TaBNO film or a material comprising metal, silicon (Si), oxygen (O) and nitrogen (N) (such as TaSiON, ZrSiON or the like), a sufficient contrast can be obtained with the wavelength of 257 nm of mask pattern inspection light which is used at present.

However, in the mask forming process and the pattern transcription process, it is important to notice not only the reflectivity with respect to the wavelength (190 to 260 nm) of the mask pattern inspection light but also the reflectivity with respect to a wavelength of 400 to 1,200 nm. The light having a wavelength of 400 to 1,200 nm is generally employed as "a position sensor" at the time of transferring or handling a mask. Accordingly, when the reflectivity is not in a predetermined range, a problem of inaccuracy in substrate position, namely inaccuracy in patterning may take place. The reflectivity with respect to the wavelength of light employed as a position sensor varies depending on devices used in each process (inspecting, pattern writing, etching, exposing), however, "less than 40% at 405 nm", "30 to 50% in 600 to 650 nm", "more than 50% in 800 to 900 nm" and "less than 90% in 1,000 to 1,200 nm" are generally required.

In order to solve the problems in the above-mentioned conventional technique, the present invention is to provide an EUV mask blank with a low-reflective layer which is excellent in characteristics for the EUV mask blank, namely, it has a low reflectivity with respect to EUV light and a mask pattern inspection light of wavelength region (190 to 260 nm) and it satisfies a predetermined reflectivity in a wavelength region (400 to 1,200 nm) required for the mask forming process and the pattern transcription process.

Solution to Problem

The inventors of this application have devoted to solve the above-mentioned problems and they have found that when the low-reflective layer is made of a film which contains at least tantalum (Ta), oxygen (O) and hydrogen (H) (hereinbelow, referred to as "TaOH film") or a film containing at least Ta, N, O and H (hereinbelow, referred to as "TaONH film"), it has not only a low reflection characteristics with respect to EUV light and the mask pattern inspection light (wavelength: 190 to 260 nm) but also it satisfies a predetermined reflectivity in a wavelength region (400 to 1,200 nm) required for the mask forming process and the pattern transcription process.

The present invention achieved based on the above-mentioned knowledge, is to provide a reflective mask blank for EUV lithography having a reflective layer for reflecting EUV light, an absorbing layer for absorbing EUV light and a low-reflective layer with respect to a mask pattern inspection light (wavelength: 190 to 260 nm), which are formed in this order on a substrate, the reflective mask blank being characterized in that the low-reflective layer contains at least tantalum (Ta), oxygen (O) and hydrogen (H), and the low-reflective layer (TaOH film) has a Ta+O total content that is between 85 and 99.9 at % (atomic percentage, it follows) and an H content that is between 0.1 and 15 at % (hereinbelow, referred to as "the EUV mask blank of the present invention").

In the EUV blank of the present invention, the low-reflective layer (TaOH film) has a Ta:O composition ratio that is Ta:O=1:8 to 3:1.

In the present invention, the composition ratio means atomic ratio.

Further, the present invention is to provide a reflective mask blank for EUV lithography having a reflective layer for reflecting EUV light, an absorbing layer for absorbing EUV light and a low-reflective layer with respect to a mask pattern inspection light (wavelength: 190 to 260 nm), which are formed in this order on a substrate, the reflective mask blank being characterized in that the low-reflective layer contains at least tantalum (Ta), oxygen (O), nitrogen (N) and hydrogen (H), and the low-reflective layer (TaONH film) has a Ta+O+N total content that is between 85 and 99.9 at % and an H content that is between 0.1 and 15 at %.

In the EUV mask blank of the present invention, it is preferred that the low-reflective layer (TaONH film) has a Ta:(O+N) composition ratio that is (Ta:(O+N))=1:8 to 3:1.

In the EUV mask blank of the present invention, it is preferred that the surface roughness (rms) of the low-reflective layer (TaOH film, TaONH film) is 0.5 nm or less.

In the EUV mask blank of the present invention, it is preferred that the crystalline structure of the low-reflective layer (TaOH film, TaONH film) is amorphous.

In the EUV mask blank of the present invention, it is preferred that the film thickness of the low-reflective layer (TaOH film, TaONH film) is between 3 and 30 nm.

In the EUV mask blank of the present invention, it is preferred that the absorbing layer contains tantalum (Ta) as main component.

In the EUV mask blank of the present invention, it is preferred that the absorbing layer contains tantalum (Ta) as main component and at least one element selected from the group of hafnium (Hf), silicon (Si), zirconium (Zr), germanium (Ge), boron (B), nitrogen (N) and hydrogen (H).

In the EUV mask blank of the present invention, it is preferred that the absorbing layer has an oxygen (O) content of less than 25 at %.

In the EUV mask blank of the present invention, it is preferred that the total film thickness of the absorbing layer and the low-reflective layer is between 30 and 200 nm.

In the EUV mask blank of the present invention, it is preferred that a protection layer is formed between the reflective layer and the absorbing layer to protect the reflective layer at the time of forming a pattern in the absorbing layer, and with respect to a wavelength (190 to 260 nm) of the mask pattern inspection light, the contrast of the reflection light at the surface of the protection layer with the reflection light at the surface of the low-reflective layer (TaOH film, TaONH film) is 60% or more.

In the EUV mask blank of the present invention, it is preferred that the hydrogen content of the low-reflective layer is at least 1 at % higher than the hydrogen content of the absorbing layer.

In the EUV mask blank of the present invention, it is preferred that with respect to a wavelength (190 to 260 nm) of the mask pattern inspection light, the reflectivity at the surface of the low-reflective layer (TaOH film, TaONH film) is 15% or less.

In the EUV mask blank of the present invention, it is preferred that the low-reflective layer (TaOH film) is formed by sputtering a Ta target in the atmosphere containing oxygen (O), hydrogen (H) and an inert gas containing at least one of helium (He), argon (Ar), neon (Ne), krypton (Kr) and xenon (Xe).

In the EUV mask blank of the present invention, it is preferred that the low-reflective layer (TaONH film) is formed by sputtering a Ta target in the atmosphere containing oxygen (O), nitrogen (N), hydrogen (H) and an inert gas containing at least one of helium (He), argon (Ar), neon (Ne), krypton (Kr) and xenon (Xe).

Further, the present invention is to provide a method for producing a reflective mask blank for EUV lithography by forming on a substrate a reflective layer for reflecting EUV light, an absorbing layer for absorbing EUV light and a low-reflective layer with respect to a mask pattern inspection light (wavelength: 190 to 260 nm) in this order, the method for producing a reflective mask blank for EUV lithography being characterized in that the low-reflective layer is formed by sputtering a Ta target in the atmosphere containing oxygen (O), hydrogen (H) and an inert gas containing at least one of helium (He), argon (Ar), neon (Ne), krypton (Kr) and xenon (Xe).

Further, the present invention is to provide a method for producing a reflective mask blank for EUV lithography by forming on a substrate a reflective layer for reflecting EUV light, an absorbing layer for absorbing EUV light and a low-reflective layer with respect to a mask pattern inspection light (wavelength: 190 to 260 nm) in this order, the method for producing a reflective mask blank for EUV lithography being characterized in that the low-reflective layer is formed by sputtering a Ta target in the atmosphere containing oxygen (O), nitrogen (N), hydrogen (H) and an inert gas containing at least one of helium (He), argon (Ar), neon (Ne), krypton (Kr) and xenon (Xe).

Further, the present invention is to provide a reflective mask for EUV lithography which is characterized by patterning the absorbing layer and the low-reflective layer of the reflective mask blank for EUV lithography of the present invention.

Further, the present invention is to provide a method for producing a semiconductor integrated circuit characterized in that the semiconductor integrated circuit is produced by exposing light to an object to be exposed with use of a reflective mask for EUV lithography of the present invention.

Advantageous Effect of Invention

The EUV mask blank of the present invention has a low reflectivity with respect to EUV light and the wavelength region (190 to 260 nm) of a mask pattern inspection light, and can satisfy predetermined values of reflectivity (405 nm: <40%, 600 to 650 nm: 30 to 50%, 800 to 900 nm: >50%, 1,000 to 1,200 nm: <90%) in a wavelength region (400 to 1,200 nm) required for the mask production process and the pattern transcription process. Accordingly, the present invention has an advantage of stabilizing the mask production process and the pattern transcription process.

DESCRIPTION OF EMBODIMENTS

In the following, the EUV mask blank of the present invention will be described with reference to drawings.

Figure 1:
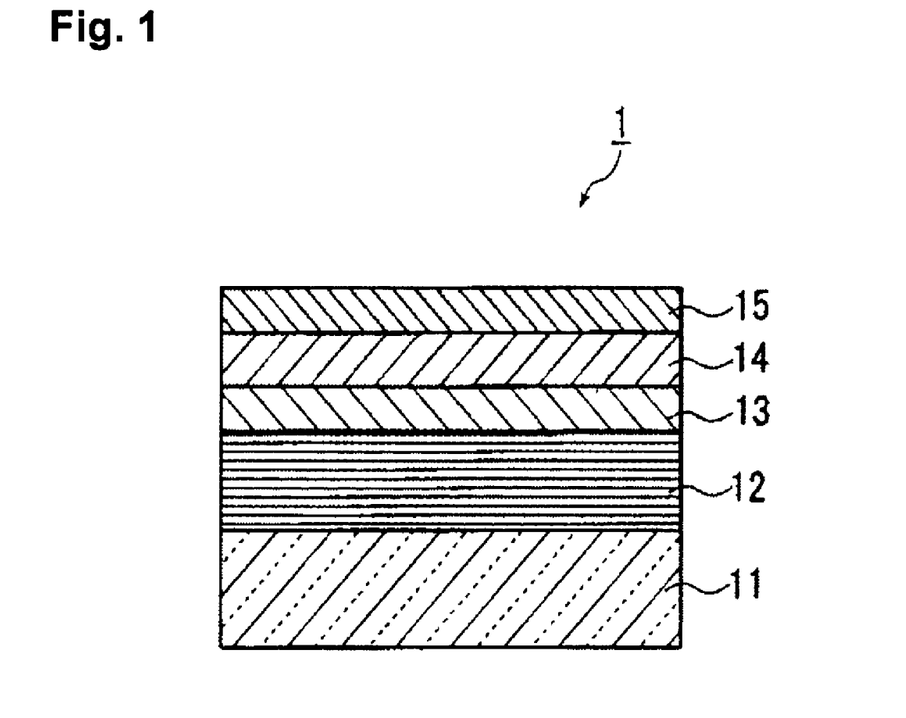
FIG. 1 is a cross-sectional view showing schematically a first embodiment of the EUV mask blank of the present invention.

FIG. 1 is a cross-sectional view showing schematically a first embodiment of the EUV mask blank of the present invention. In the mask blank 1 shown in FIG. 1, a reflective layer 12 for reflecting EUV light and an absorbing layer 14 for absorbing EUV light are formed in this order on a substrate 11. Between the reflective layer 12 and the absorbing layer 14, a protection layer 13 for protecting the reflective layer 12 at the time of forming a pattern in the absorbing layer 14, is formed. On the absorbing layer 14, a low-reflective layer 15 with respect to inspection light for inspecting a mask pattern is formed. It is noted however that in the EUV mask blank 1 of the present invention, the substrate 11, the reflective layer 12, the absorbing layer 14 and the low-reflective layer 15 are essential in the structure shown in FIG. 1, and the protection layer 13 is an optional structural element.

Description will be made as to individual structural elements of the mask blank 1.

The substrate 11 is required to satisfy the characteristics that the substrate of EUV mask blank should possess. Accordingly, the substrate 11 has preferably a low thermal expansion coefficient (specifically $0\pm0.05\times10^{-7}/°$ C., particularly preferably $0\pm0.03\times10^{-7}/°$ C. at 20° C.), and be excellent in smoothness, flatness and durability to a cleaning liquid used for cleaning the mask blank or the photomask after the formation of a pattern. The substrate 11 can be glass having a low thermal expansion coefficient, specifically, $SiO_2$—$TiO_2$ glass. However, it is not limited to such glass, but a substrate of crystallized glass with a β quartz solid solution precipitated, quartz glass, silicon, metal or the like may be employed.

From viewpoints of a cleaning effect of carbon contamination and a deoxization effect of an oxidized film, such glass has preferably a hydrogen molecule concentration of $1\times10^{16}$ molecules/cm$^3$, $5\times10^{16}$ molecules/cm$^3$, $1\times10^{17}$ molecules/cm$^3$, $5\times10^{17}$ molecules/cm$^3$ or greater. It is more preferable that the hydrogen molecule concentration is $1\times10^{18}$ molecules/cm$^3$ or greater, further preferably $5\times10^{18}$ molecules/cm$^3$ or greater, particularly preferably $1\times10^{19}$ molecules/cm$^3$ or greater. In order to maintain such effect for a longer period, it is preferred to be $5\times10^{19}$ molecules/cm$^3$ or greater.

The measurement of the hydrogen molecule concentration is preferably conducted as described below with use of a thermal desorption spectrometer (TDS) manufactured by ESCO, Ltd. as stated in the specification of Patent JP3298974.

A sample of glass into which hydrogen molecules are introduced is put in the thermal desorption spectrometer, the interior of the measuring chamber is vacuumed to $5\times10^{-7}$ Pa or lower and then the sample of glass is heated. The mass number of gas thus generated is measured with a mass spectrometer placed inside TDS. In the separation profile of hydrogen molecules, peaks are observed in a region of around 200 to 800° C. wherein the maximum value appears at around 420° C. Further, in the separation profile of water molecule, the peaks observed in the region of around 100 to 200° C. wherein the maximum value appears at around 150° C. are considered that water adsorbed physically on the glass surface is separated.

Then, a sample of glass without introducing hydrogen molecule is put in the thermal desorption spectrometer and the interior of the measuring chamber is vacuumed to $5\times10^{-7}$ Pa or lower, and then the sample is heated in the same manner, to measure the mass number of gas generated. The observed peaks are considered to be owing to the separation of water adsorbed physically at around 100 to 200° C. On the other hand, a peak having the maximum value at around 420° C. was not observed.

From this, it can be considered that the peaks observed at around 200 to 800° C. wherein the maximum value appears at around 420° C. is owing to the separation of hydrogen molecules introduced in the glass. Accordingly, the number of hydrogen molecules separated from the measured sample can be calculated from the integrated strength ratio of separation peaks of hydrogen molecules of the measured sample and a standard sample in which the hydrogen concentration is already known.

In a case of using hydrogen-ion-injected silicon as a standard sample for example, the following measuring method is employed. Silicon (manufactured by ESCO, Ltd.) in which $1\times10^{16}$ hydrogen ions were injected was placed in the thermal desorption spectrometer, the interior of the measuring chamber was vacuumed to $5\times10^{-7}$ Pa or lower, and then the sample is heated. Separation peaks were observed at around 350 to 750° C. wherein the maximum appeared at around 550° C. These peaks take place at the time of the separation of $1\times10^{16}$ hydrogen ions in the silicon.

It is preferred that the substrate 11 has a smooth surface of 0.15 nm or less in terms of surface roughness (rms) and a flatness of 100 nm or less because the photomask after the formation of a pattern provides a high reflectivity and an accurate transcription.

The size or the thickness of the substrate 11 is determined appropriately depending on designed values of the mask. In an example described later, a $SiO_2$—$TiO_2$ glass of 6 inches (152 mm) square in outer contour and of 0.25 inches (6.3 mm) thick was employed.

It is preferred that no defect exists in the surface of substrate 11 on which the reflective layer 12 is formed. Even in the case that a defect exists, the depth of a defect having a recess and the height of a defect having a projection should be 2 nm or less and the half width values of theses defects of recess and projection be 60 nm or less so as not to cause a topological defect due to the defect of recess and/or the defect of projection.

The reflective layer 12 is not in particular limited as long as it has predetermined characteristics as the reflective layer for the EUV mask blank. Here, the reflective layer 12 is particularly required to have a high reflectivity of EUV ray. Specifically, when a ray in the wavelength region of EUV light is irradiated to the surface of the reflective layer 12 at an incident angle of 6°, the maximum value of the reflectivity to the ray having a wavelength of around 13.5 nm is preferably 60% or more, more preferably 65% or more. Even in a case of providing the protection layer 13 or the low-reflective layer 15 on the reflective layer 12, it is preferable that the maximum value of the reflectivity of the ray having a wavelength of around 13.5 nm is 60% or more, more preferably 65% or more.

The reflective layer 12 can achieve a high reflectivity to EUV light, and accordingly, a multilayered reflective film formed by laminating alternately a layer of high refractive index and a layer of low refractive index plural times is generally employed as the reflective layer 12. In this multilayered reflective film forming the reflective layer 12, Mo is widely employed for the layer of high refractive index and Si is widely used for the layer of low refractive index. Namely, a Mo/Si multilayered reflective film is most common. However, the multilayered reflective film is not limited thereto, but a Ru/Si multilayered reflective film, a Mo/Be multilayered reflective film, a Mo compound/Si compound multilayered reflective film, a Si/Mo/Ru multilayered reflective film, a Si/Mo/Ru/Mo multilayered reflective film or a Si/Ru/Mo/Ru multilayered reflective film may be employed.

The film thickness of each layer constituting the multilayered reflective film for the reflective layer 12 and the number of the repeating unit of the layers are properly determined depending on materials of the films used and the EUV ray reflectivity required for this reflective layer. Taking the Mo/Si reflective film as an example, and in order to form a reflective layer 12 wherein the maximum value of the EUV ray reflectivity is at least 60%, the multilayered reflective film can be formed by laminating a Mo layer having a film thickness of 2.3±0.1 nm and a Si layer having a film thickness 4.5±0.1 nm so as to have a repeating unit of 30 to 60.

Each of the layers constituting the multilayered reflective film for the reflective layer 12 is formed to have a desired thickness by using a known film deposition method such as magnetron sputtering method, ion beam sputtering method or the like. For example, when a Si/Mo multilayered reflective film is formed by using an ion beam sputtering method, a Si target is used as the target and an Ar gas (a gas pressure of $1.3 \times 10^{-2}$ Pa to $2.7 \times 10^{-2}$ Pa) is used as sputtering gas, and a Si film is formed to have a thickness of 4.5 nm under an ion acceleration voltage of 300 to 1,500 V and a film deposition rate of 0.03 to 0.30 nm/sec, and then, a Mo target is used as the target and an Ar gas (a gas pressure of $1.3 \times 10^{-2}$ Pa to $2.7 \times 10^{-2}$ Pa) is used as sputtering gas to deposit a Mo film having a thickness of 2.3 nm under an ion acceleration voltage of 300 to 1,500 V and a film deposition rate of 0.03 to 0.30 nm/sec. By taking the above-mentioned operation as one cycle, the Si film and the Mo film are laminated in a cycle of 40 to 50 to thereby obtain a Si/Mo multilayered reflective film.

It is preferred that in order to prevent the surface of the reflective layer 12 from being oxidized, the uppermost layer of the multilayered reflective film for the reflective layer 12 should be the layer of a material hardly oxidized. The layer of a material hardly oxidized functions as a cap layer for the reflective layer 12. As a concrete example of the layer of a material hardly oxidized which functions as the cap layer, there is a Si layer. When the multilayered reflective film for the reflective layer 12 is a Si/Mo film, its uppermost layer be a Si layer, so that the uppermost layer can function as the cap layer. In this case, the film thickness of the cap layer is preferably 11±2 nm.

The protection layer 13 is provided for the purpose as follows. When a pattern is formed in the absorbing layer 14 by an etching process, normally by a dry etching process, the reflective layer 12 may suffer a damage by the etching process. Accordingly, the protection layer 13 is to protect the reflective layer 12. Therefore, the material which hardly suffers influence of the etching process to the absorbing layer 14 is selected for the protection layer 13, namely, such a material that the etching rate to the protection layer is lower than that of the absorbing layer 14 and that hardly suffers a damage by the etching process, is selected. The material satisfying this condition may be Cr, Al and Ta, a nitride thereof, Ru, a Ru compound (RuB, RuSi etc.), $SiO_2$, $Si_3N_4$, $Al_2O_3$ and a mixture thereof. Among these, it is preferred to use Ru, a Ru compound (RuB, RuSi etc.), and at least one of CrN and $SiO_2$, it is particularly preferred to use Ru or a Ru compound (RuB, RuSi etc.).

The thickness of the protection layer 13 is preferably 1 to 60 nm.

The protection layer 13 is formed by using a known deposition method such as a magnetron sputtering method or an ion beam sputtering method. When a Ru film is deposited by the magnetron sputtering method, it is preferred that the film is deposited so as to have a thickness of 2 to 5 nm, by using a Ru target as the target, using an Ar gas (a gas pressure of $1.0 \times 10^{-2}$ Pa to $10 \times 10^{-1}$ Pa) as the sputtering gas, applying a power of 30 to 1,500 V and setting the film deposition rate to be 0.02 to 1.0 nm/sec.

As the characteristics required particularly for the absorbing layer 14, it should have an extremely low EUV ray reflectivity. Specifically, it is preferred that the maximum reflectivity of ray having a wavelength of around 13.5 nm is 0.5% or less, more preferably, 0.1% or less when a ray in the wavelength region of EUV light is irradiated onto the surface of the absorbing layer 14.

In the EUV mask blank 1 of the present invention, it is preferred that the maximum reflectivity of a ray with a wavelength of around 13.5 nm is 0.5 or less, more preferably is 0.1 or less even when a ray having a wavelength region of EUV light is irradiated onto the surface of the low-reflective layer 15.

In order to achieve the above-mentioned characteristics, the absorbing layer 14 should be made of a material having a high absorption coefficient on the EUV light. As the material having high absorption coefficient on the EUV light, it is preferred to employ a material containing tantalum (Ta) as main component. In this description, the material containing tantalum (Ta) as main component means a material containing tantalum of at least 40 at %, preferably at least 50 at %, more preferably at least 55 at %.

The material containing Ta as main component used for the absorbing layer 14 may contain, other than Ta, at least one element selected from the group consisting of hafnium (Hf), silicon (Si), zirconium (Zr), germanium (Ge), boron (B), nitrogen (N) and hydrogen (H). As concrete examples of the material containing such element(s) other than Ta, there are, for example, TaN, TaNH, TaHf, TaHfN, TaBSi, TaBSiH, TaBSiN, TaBSiNH, TaB, TaBH, TaBN, TaBNH, TaSi, TaSiN, TaGe, TaGeN, TaZr, TaZrN and so on.

However, it is preferred that the absorbing layer contains a B content of 3 at % or less, more preferably 1 at % or less. It is especially preferred that it does not contain B.

However, it is preferred that the absorbing layer 14 does not contain oxygen (O). Specifically, it is preferred that the O content in the absorbing layer 14 is less than 25 at %. When a pattern is formed in the absorbing layer 14, a dry etching process is normally employed, and as etching gas, a chlorine-type gas (or a gas mixture containing a chlorine-type gas) or a fluorine-type gas (or a gas mixture containing a fluorine-type gas) is normally employed. When a film containing Ru or a Ru compound is formed as the protection layer on the reflective layer in order to avoid a damage to the reflective layer by the etching process, the chlorine-type gas is generally employed as etching gas because of little damage to the protection layer. However, in the case of conducting a dry etching process using the chlorine-type gas, if the absorbing layer 14 contains oxygen, the etching rate decreases and the resist suffers a large damage, therefore undesirable. It is preferred that the oxygen content in the absorbing layer 14 is 15 at % or less, more preferable that is 10 at % or less, and further preferable that is 5 at % or less.

In the absorbing layer 14, it is preferred that its film thickness is so determined that the total film thickness of the absorbing layer 14 and the low-reflective layer 15 is between 30 and 200 nm, more preferably between 35 and 200 nm, further preferably between 50 and 200 nm.

The absorbing layer 14 having the above-mentioned structure can be formed by a known film deposition method, for example, a magnetron sputtering method or an ion beam sputtering method.

When a TaNH film is deposited by using the magnetron sputtering method to form the absorbing layer 14, for example, the formation of the film can be conducted under the following conditions.

Sputtering target: Ta target

Sputtering gas: A gas mixture of Ar, $N_2$ and $H_2$ ($H_2$ gas concentration of 1 to 50 vol %, preferably 1 to 30 vol %; $N_2$ gas concentration of 1 to 80 vol %, preferably 5 to 75 vol %; Ar gas concentration of 5 to 95 vol %, preferably 10 to 94 vol %; gas pressure of $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa).

Applied power: 30 to 1,000 W, preferably 50 to 750 W, more preferably 80 to 500 W Film deposition rate: 0.5 to 60 nm/min, preferably 1.0 to 45 nm/min, more preferably 1.5 to 30 nm/min The low-reflective layer 15 is made of a film which shows low reflection characteristics with respect to the wavelength of inspection light used for inspecting a mask pattern. In the production of an EUV mask, after a pattern was formed in the absorbing layer, an inspection is conducted whether or not this pattern has been correctly formed according to a predetermined design. In the inspection of the mask pattern, an inspection device using a light of about 257 nm is at present employed, as inspection light. Namely, it detects the difference of reflectivity with respect to the inspection light having such wavelength. Specifically, the inspection is conducted to find the difference of reflectivity between the surface which appears after the absorbing layer 14 has been removed by forming a pattern and the surface of the absorbing layer 14 remained without being removed by the pattern formation. Namely, the inspection is conducted to find the contrast of reflection light at these surfaces. Here, the former indicates the surface of the reflective layer 12. However, when the protection layer 13 is formed on the reflective layer 12, it indicates the surface of the protection layer 13. Accordingly, in a case of small difference of reflectivity between the surface of the reflective layer 12 or the surface of the protection layer 13 and the surface of the absorbing layer 14 with respect to the wavelength of the inspection light, the contrast in the inspection is not good and a correct inspection result is not obtainable.

The absorbing layer 14 having the above-mentioned structure has an extremely low EUV ray reflectivity and excellent characteristics as an absorbing layer for the EUV mask blank 1. However, when inspection light having a certain wavelength is used, the ray reflectivity cannot always be sufficiently low. As a result, there is a case that the difference between the reflectivity at the surface of the absorbing layer 14 and the reflectivity at the surface of the protection layer 13 with respect to the wavelength of inspection light is small whereby there is a possibility that a sufficient contrast is not obtainable in the inspection. When a sufficient contrast cannot be obtained in the inspection, a defect of a pattern in the inspections of mask pattern cannot sufficiently be discriminated, so that a correct defect-finding inspection cannot be carried out.

In the EUV mask blank 1 of the present invention, a good contrast is obtainable in the inspection because the low-reflective layer 15 with respect to inspection light for inspecting mask patterns is formed on the absorbing layer 14. When the EUV mask blank 1 of the present invention is used, the contrast of reflection light indicates the difference of reflectivity of light between the surface of the reflective layer 12 and the surface of the low-reflective layer 15 with respect to certain wavelength of inspection light. However, when the protection layer 13 is formed on the reflective layer 12, it indicates the difference of reflectivity of light between the surface of the protection layer 13 and the surface of the low-reflective layer 15.

In the EUV mask blank 1 of the present invention, when the low-reflective layer 15 is formed on the absorbing layer 14, the reflectivity with respect to the wavelength region (190 to 260 nm) of inspection light for inspecting mask patterns is very low. Specifically, when a ray having the wavelength region (190 to 260 nm) of inspection light for mask patterns is irradiated onto the surface of the low-reflective layer 15, it is preferred that the reflectivity of ray at the surface of the low-reflective layer 15 is 15% or less, more preferably 10% or less, much more preferably 8% or less.

When the maximum reflectivity of ray at the surface of the low-reflective layer 15 with respect to the wavelength region (190 to 260 nm) of inspection light for mask patterns is 15% or less, the contrast in the inspection is good. Specifically, the contrast between the reflection light at the surface of the reflective layer 12 (when the protection layer 13 is formed on the reflective layer 12, reflection light at the surface of the protection layer 13) and reflection light at the surface of the low-reflective layer 15, is 60% or greater.

Figure 2:
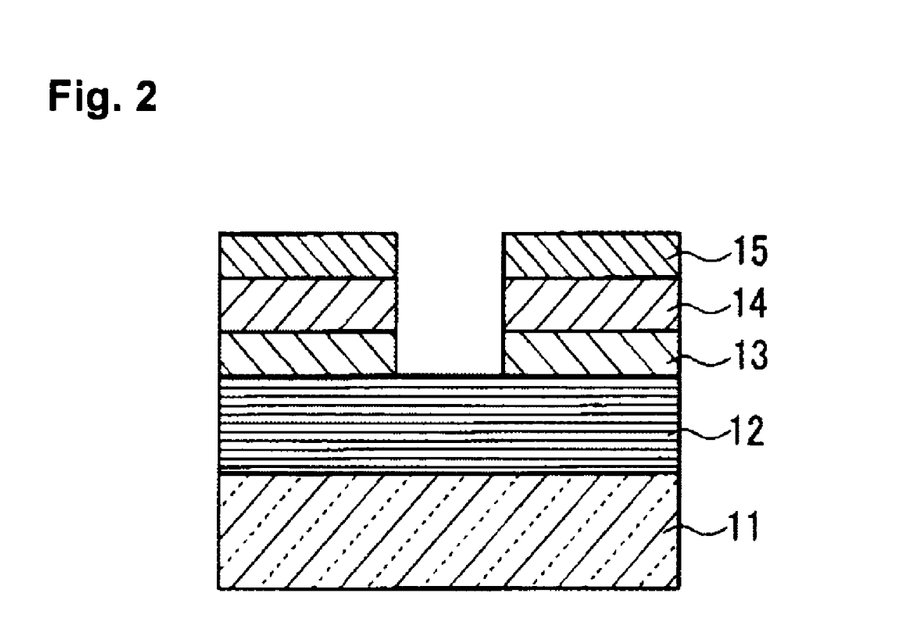
FIG. 2 shows a state that a pattern is formed in the absorbing layer 14 and the low-reflective layer 15 of the EUV mask blank 1 shown in FIG. 1.

In this description, the contrast is obtainable by using the following formula:

Contrast (%) = $((R_2 - R_1)/(R_2 + R_1)) \times 100$

Wherein $R_2$ represents the reflectivity at the surface of the reflective layer 12 with respect to the wavelength of the inspection light. However, when the protection layer 13 is formed on the reflective layer 12, it indicates the reflectivity at the surface of the protection layer 13. $R_1$ represents the reflectivity at the surface of the low-reflective layer 15 with respect to the wavelength of the inspections light. These $R_1$ and $R_2$ are measured, as shown in FIG. 2, in a state that a pattern is formed in the absorbing layer 14 and the low-reflective layer 15 of the EUV mask blank 1 shown in FIG. 1. The above-mentioned $R_2$ is a value measured at the surface of the reflective layer 12 or the surface of the protection layer 13 which is exposed in the air as a result that the absorbing layer 14 and the low-reflective layer 15 are removed by the formation of a pattern, and the $R_1$ is a value measured at the surface of the low-reflective layer 15 which remains without being removed by the pattern formation.

In the present invention, the contrast represented in the above formula is preferably 65% or more, more preferably 70% or more.

The low-reflective layer 15 should satisfy a predetermined reflectivity in the wavelength region (400 to 1,200 nm) which is required for a mask production process and a pattern transcription process, and it is preferred that the following requirements are satisfied.

405 nm: <40%

600 to 650 nm: 30 to 50%

800 to 900 nm: >50%

1,000 to 1,200 nm: <90%

In order to achieve the above-mentioned characteristics, it is preferred that the low-reflective layer 15 of the EUV mask blank 1 of the present invention contains the elements described below at a specified ratio.

In the first embodiment of the low-reflective layer 15, it is a TaOH film containing at least tantalum (Ta), oxygen (O) and hydrogen (H). When the low-reflective layer 15 is the TaOH film, the total content of Ta and O is between 85 and 99.9 at %, and H content is between 0.1 and 15 at %.

When the H content is less than 0.1 at %, it is impossible to satisfy a predetermined reflectivity in the wavelength region (400 to 1,200 nm) required for the mask production process and the pattern transcription process. H is a material having a low absorption coefficient of EUV light. If the H content of the low-reflective layer 15 is more than 15 at %, then it will increase the total film thickness of absorbing layer 14 and low-reflective layer 15 which is required for the reflectivity of EUV light to be 0.5% or less, which depends also on the H content and the film thickness of the absorbing layer 14, therefore it is undesirable.

When the low-reflective layer 15 is of a TaOH film, it is preferable that the composition (atomic) ratio of Ta:O is between 1:8 and 3:1.

When the low-reflective layer 15 is of a TaOH film, the H content is preferably between 1 and 15 at %, further preferably between 3 and 15 at %, between 5 and 15 at %, between 5 and 12 at % or between 5 and 10 at %.

Further, it is preferred that the total content of Ta and O is between 85 and 99 at %, more preferably between 85 and 95 at %, particularly preferably between 90 and 95 at %.

It is preferred that the composition ratio of Ta:O is between 1:7 and 2:1, more preferably between 1:6 and 1:1, particularly preferably between 1:5 and 1:1.

In a second embodiment of the low-reflective layer 15, it is a TaONH film containing at least tantalum (Ta), oxygen (O), nitrogen (N) and hydrogen (H). When the low-reflective layer 15 is the TaONH film, the total content of Ta, O and N is between 85 and 99.9 at %, and the H content is between 0.1 and 15 at %. If the H content is less than 0.1 at %, it is impossible to satisfy a predetermined reflectivity in the wavelength region (400 to 1,200 nm) required for the mask production process and the pattern transcription process. H is a material having a low absorption coefficient of EUV light. If the H content of the low-reflective layer 15 is more than 15 at %, it will increase the total film thickness of absorbing layer 14 and low-reflective layer 15 which is required for the reflectivity of EUV light to be 0.5% or less, which depends also on the H content and the film thickness of the absorbing layer 14, therefore it is undesirable.

When the low-reflective layer 15 is of a TaONH film, it is preferred that the composition (atomic) ratio of Ta:(O+N) is between 1:8 and 3:1.

When the low-reflective layer 15 is of a TaONH film, it is preferred that the H content is between 1 and 15 at %, more preferably between 3 and 15 at %, between 5 and 15 at %, particularly preferably between 5 and 10 at %. It is preferred that the total content of Ta, O and N is between 85 and 99 at %, more preferably between 85 and 95 at %, particularly preferably between 90 and 95 at %. It is preferred that the composition ratio of Ta:(O+N) is between 1:7 and 2:1, more preferably between 1:6 and 1:1, particularly preferably between 1:5 and 1:1 or between 1:4 and 1:2.

The TaOH film is a film which contains at least Ta, O and H, and accordingly, the film may contain another element other than these elements. Further, the TaONH film is a film which contains at least Ta, O, N and H, and accordingly, the film may contain another element other than these elements. However, in order to achieve an intended low reflection characteristic with respect to the wavelength region of inspection light for mask patterns, it is preferred that the content of the other element(s) is 5 at % or less, preferably 2 at % or less, particularly preferably 1 at % or less.

From the viewpoint of low reflection characteristic, the Cr content in the low-reflective layer is 3 at % or less, more preferably, 2 at % or less, particularly preferably 1 at % or less. Further, the Ti content in the low-reflective layer is 3 at % or less, more preferably 2 at % or less, particularly preferably 1 at % or less. The B content in the low-reflective layer is 5 at % or less, more preferably 3 at % or less, and further preferably 1 at % or less. It is particularly preferable that it does not contain B. Further, the hydrogen content in the low-reflective layer is preferably at least 1 at % or higher, at least 2.5% or higher, further, at least 4 to 8 at % higher than the hydrogen content in the absorbing layer, from the viewpoint of low reflection characteristic.

It is preferred that the low-reflective layer 15 (TaOH film or TaONH film) with the above-mentioned structure is amorphous in its crystalline state. In this description, "the crystalline state is amorphous" includes a microcrystalline structure other than an amorphous structure which does not have the crystalline structure at all.

The low-reflective layer 15 (TaOH film or TaONH film) is made of a film of amorphous structure of a film of microcrystalline structure, and accordingly, it is preferred that the surface roughness (rms) of the low-reflective layer 15 is 0.5 nm or less. The surface roughness of the absorbing layer 15 can be measured with an atomic force microscope. If the surface roughness of the low-reflective layer 15 is larger, the edge roughness of a pattern formed in the low-reflective layer 15 becomes large whereby the dimensional accuracy of the pattern decreases. As the pattern is finer, the influence of the edge roughness is remarkable, and accordingly, the surface of the low-reflective layer 15 should be smooth.

When the surface roughness (rms) of the low-reflective layer 15 is 0.5 nm or less, the surface of the low-reflective layer 15 is sufficiently smooth, so that there is no trouble of the deterioration of dimensional accuracy of pattern due to the edge roughness. The surface roughness (rms) of the low-reflective layer 15 is more preferably 0.4 nm or less, much more preferably 0.3 nm or less.

The crystalline state of the low-reflective layer 15 (TaOH film or TaONH film) being amorphous, i.e. it has an amorphous structure or a microcrystalline structure, can be verified by an X-ray diffraction (XRD) method. When the crystalline state of the low-reflective layer 15 is an amorphous structure or a microcrystalline structure, a sharp peak is not found in the diffraction peaks obtained by the XRD measurement.

The low-reflective layer may be formed by oxidizing the surface of the absorbing layer by an oxygen plasma treatment or the like.

It is preferred that the total film thickness of the absorbing layer 14 and the low-reflective layer 15 (TaOH film or TaONH film) is between 30 and 200 nm, more preferably between 35 and 200 nm, much more preferably between 50 an 200 nm.

When the film thickness of the low-reflective layer 15 is greater than the film thickness of the absorbing layer 14, there is a possibility that EUV light absorption characteristics at the absorbing layer 14 decrease, and accordingly, the film thickness of the low-reflective layer 15 should be smaller than the film thickness of the absorbing layer. Therefore, the thickness of the low-reflective layer 15 is preferably between 3 and 30 nm, more preferably between 5 and 20 nm.

From the viewpoint of low reflection characteristics, it is preferred that the low-reflective layer 15 is in direct contact with the absorbing layer.

The low-reflective layer 15 (TaOH film, TaONH film) having the above-mentioned structure can be formed by conducting a sputtering method using a Ta target, e.g. a magnetron sputtering method or an ion beam sputtering method.

When the low-reflective layer 15 is of a TaOH film, it is formed by an electric discharge of Ta target in the atmosphere containing oxygen (O), hydrogen (H) and an inert gas containing at least one of helium (He), argon (Ar), neon (Ne), krypton (Kr) and xenon (Xe).

On the other hand, when the low-reflective layer 15 is of a TaONH film, it is formed by an electric discharge of Ta target in the atmosphere containing oxygen (O), nitrogen (N), hydrogen (H) and an inert gas containing at least one of helium (He), argon (Ar), neon (Ne), krypton (Kr) and xenon (Xe).

In order to form the low-reflective layer 15 on the absorbing layer 14 according to the above-mentioned method, it may be conducted under the following film deposition conditions.

Conditions of Depositing Low-Reflective Layer 15 (TaOH Film)

Sputtering gas: A gas mixture of Ar, $O_2$ and $H_2$ ($H_2$ gas concentration of 1 to 50 vol %, preferably 1 to 30 vol %; $O_2$ gas concentration of 1 to 80 vol %, preferably 5 to 75 vol %; Ar gas concentration of 5 to 95 vol %, preferably 10 to 94 vol %; gas pressure of $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa).

Applied power: 30 to 1,000 W, preferably 50 to 750 W, more preferably 80 to 500 W Film deposition rate: 0.01 to 60 nm/min, preferably 0.05 to 45 nm/min, more preferably 0.1 to 30 nm/min When an inert gas is used instead of Ar, the concentration of the inert gas should be in the same range as the concentration of the Ar gas concentration.

Conditions of Depositing Low-Reflective Layer 15 (TaONH Film)

Sputtering gas: A gas mixture of Ar, $O_2$, $N_2$ and $H_2$ ($H_2$ gas concentration of 1 to 50 vol %, preferably 1 to 30 vol %; $O_2$ gas concentration of 1 to 80 vol %, preferably 5 to 75 vol %; $N_2$ gas concentration of 1 to 80 vol %, preferably 5 to 75 vol %; Ar gas concentration of 5 to 95 vol %, preferably 10 to 89 vol %; gas pressure of $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa).

Applied power: 30 to 1,000 W, preferably 50 to 750 W, more preferably 80 to 500 W Film deposition rate: 0.01 to 60 nm/min, preferably 0.05 to 45 nm/min, more preferably 0.1 to 30 nm/min When an inert gas is used instead of Ar, the concentration of the inert gas should be in the same range as the concentration of the Ar gas concentration.

The EUV mask blank 1 of the present invention may have a functional film which is already known in the field of EUV mask blank, in addition to the reflective layer 12, the protection layer 13, the absorbing layer 14 and the low-reflective layer 15. As a concrete example of such functional film, there is, for example, a high dielectric coating to be applied to the back surface of the substrate, which provides a static chuck for the substrate, as described in JP-A-2003-501823. Here, the back surface of the substrate indicates the surface which is opposite the surface where the reflective layer 12 is formed, in the substrate 11 shown in FIG. 1. In a material constituting the high dielectric coating applied to the back surface of the substrate to perform such object, the electric conductivity and the film thickness are determined so that the sheet resistance be 100 Ω/square or less. The material of high dielectric coating can widely be selected from those described in known documents. For example, the high dielectric coating described in JP-A-2003-501823, specifically, a coating of silicon, TiN, molybdenum, chrome or TaSi can be employed. The thickness of the high dielectric coating can, for example, be 10 to 1,000 nm.

The high dielectric coating can be formed according a known film forming method such as sputtering method, e.g. magnetron sputtering method, ion beam sputtering method, CVD method, vacuum deposition method or electrolytic plating.

The EUV mask can be produced by patterning at least the absorbing layer of the mask blank of the present invention. The patterning method for the absorbing layer is not in particular limited. For example, a method of applying a resist on the absorbing layer to form a resist pattern and by etching the absorbing layer through the resist pattern as a mask, can be employed. The material for the resist and the writing of a resist pattern may be selected appropriately in consideration of the material for the absorbing layer and so on. The etching method for the absorbing layer is not in particular limited and dry etching such as reactive ion etching or wet etching may be employed. After patterning is conducted to the absorbing layer, the resist is removed by a removing liquid whereby an EUV mask can be obtained.

Description will be made as to a method for producing a semiconductor integrated circuit by using the EUV mask of the present invention. The present invention can be applied to the method for producing a semiconductor integrated circuit according to a photolithography method using EUV light as a light source for exposure. Specifically, a substrate such as silicon wafer or the like on which a resist is applied, is placed on the stage and the EUV mask is set in a reflective exposure device which is constructed by combining a reflecting mirror. Then, the EUV light is irradiated from the light source to the EUV mask via the reflecting mirror, so that the EUV light is reflected by the EUV mask to be irradiated to the substrate on which the resist is applied. By such pattern transcription process, a circuit pattern is transcribed on the substrate. The substrate transcribed with the circuit pattern is subjected to development to etch a photosensitive portion or a non-photosensitive portion, and then the resist is removed. By repeating such process, a semiconductor integrated circuit is produced.

EXAMPLES

In the following, the present invention will be described with Examples, however, the present invention should not be limited to these Examples.

Example 1

In this Example, the EUV mask blank 1 shown in FIG. 1 was prepared. A $SiO_2$—$TiO_2$ type glass substrate (outer dimensions: 6 inches (152 mm) square and thickness: 6.3 mm) was used as the substrate 11 for depositing a film. This glass substrate has a thermal expansion coefficient of $0.2 \times 10^{-1}$/° C., a Young's modulus of 67 GPa, a Poisson's ratio of 0.17 and a specific rigidity of $3.07 \times 10^7$ m²/s². This glass substrate was polished so that the surface having a surface roughness (rms) of 0.15 nm or less and a flatness of 100 nm or less was formed.

On the back side of the substrate 11, a Cr film having a thickness of 100 nm was deposited by using a magnetron sputtering method whereby a high dielectric coating having a sheet resistance of 100 Ω/square was formed.

The substrate 11 (outer dimensions: 6 inches (152 mm) square, thickness: 6.3 mm) was fixed to an ordinary static chuck in flat plate by utilizing the formed Cr film, and a Si film and a Mo film were deposited on the surface of the substrate 11 alternately in 40 cycles by an ion beam sputtering method, whereby a Si/Mo multilayered reflective film (reflective layer 12) having a total film thickness of 272 nm ((4.5 nm+2.3 nm)×40) was formed.

Then, on the Si/Mo multilayered reflective film (the reflective layer 12), a Ru film (film thickness: 2.5 nm) was deposited by using an ion beam sputtering to thereby form the protection layer 13.

The conditions of depositing Si film, Mo film and Ru film are as follows.
Conditions of Depositing Si Film
  Target: Si target (boron-doped)
  Sputtering gas: Ar gas (gas pressure: 0.02 Pa)
  Voltage: 700 V
  Film deposition rate: 0.077 nm/sec
  Film thickness: 4.5 nm
Conditions of Depositing Mo Film
  Target: Mo target
  Sputtering gas: Ar gas (gas pressure: 0.02 Pa)
  Voltage: 700 V
  Film deposition rate: 0.064 nm/sec
  Film thickness: 2.3 nm
Conditions of Depositing Ru Film
  Target: Ru target
  Sputtering gas: Ar gas (gas pressure: 0.02 Pa)
  Voltage: 500 V
  Film deposition rate: 0.023 nm/sec
  Film thickness: 2.5 nm Then, on the protection layer 13, a TaNH film containing Ta, N and H was formed by using a magnetron sputtering method to form the absorbing layer 14.

The absorbing layer 14 (TaNH film) was deposited according to the following method. The film composition is measured with an X-ray photoelectron spectrometer (manufactured by PERKIN ELEMER-PHI), a secondary ion mass spectrometer (manufactured by PHI-ATOMIKA) and a Rutherford back scattering spectroscopy (manufactured by Kobe Steel, Ltd.). The composition of the absorbing layer is Ta:N:H=55:42:3. The O content of the absorbing layer is 0.05 at % or less.
Conditions of Depositing Absorbing Layer 14 (TaNH Film)
  Target: Ta target
  Sputtering gas: a gas mixture of Ar, $N_2$ and $H_2$ (Ar: 89 vol %, $N_2$: 8.3 vol %, $H_2$: 2.7 vol %, gas pressure: 0.46 Pa)
  Applied power: 300 W
  Film deposition rate: 1.5 nm/min
  Film thickness: 70 nm Then, on the absorbing layer 14, a low-reflective layer 15 (TaONH film) containing Ta, O, N and H was deposited by using a magnetron sputtering method to thereby obtain an EUV mask blank 1 wherein the reflective layer 12, the protection layer 13, the absorbing layer 14 and the low-reflective layer 15 were formed in this order on the substrate 11.
Conditions of depositing the low-reflective layer 15 (TaONH film) are as follows.
Conditions of Depositing Low-Reflective Layer 15 (TaONH Film)
  Target: Ta target
  Sputtering gas: a gas mixture of Ar, $O_2$, $N_2$ and $H_2$ (Ar: 48 vol %, $O_2$: 36 vol %, $N_2$: 14 vol %, $H_2$: 2 vol %, gas pressure: 0.3 Pa)
  Applied power: 450 W
  Film deposition rate: 1.5 nm/min
  Film thickness: 10 nm The following evaluations (1) to (5) were conducted to the low-reflective layer 15 (TaONH film) obtained according to the above-mentioned procedure.

(1) Film Composition

The composition of the low-reflective layer 15 (TaONH film) is measured with an X-ray photoelectron spectrometer (manufactured by PERKIN ELEMER-PHI) and a Rutherford back scattering spectroscopy (manufactured by Kobe Steel, Ltd). The composition ratio (at %) of the low-reflective layer is Ta:O:N:H=22:65:5:8.

(2) Crystalline State

The crystalline state of the low-reflective layer 15 (TaONH film) was verified with an X-ray diffractmeter (manufactured by Rigaku Corporation). It was verified that the crystalline state of the low-reflective layer 15 (TaONH film) was an amorphous structure or a microcrystalline structure because no sharp peak was found in the obtained diffraction peaks.

(3) Surface Roughness

The surface roughness of the low-reflective layer 15 (TaONH film) is verified with an atomic force micrometer (manufactured by SII, SPI-3800) in dynamic force mode. The measurement region of surface roughness is 1 μm×1 μm and a cantilever (manufactured by SII, SI-DF40) is employed. The surface roughness (rms) of the low-reflective layer is 0.30 nm.

(4) Evaluation of Reflection Characteristics (Evaluation of Contrast)

In this Example, the reflectivity of mask pattern inspection light (wavelength: 257 nm) at the surface of the protection layer 13 was measured with a spectrophotometer (HITACHI, UV-4100) at the step of having formed the protection layer 13 (Ru film). Further, after the formation of the low-reflective layer 15 (TaONH film), the reflectivity of mask pattern inspection light at the surface of the low-reflective layer was measured. As a result, the reflectivity with respect to a wavelength 257 nm at the surface of the protection layer 13 was 56.0%. On the other hand, the reflectivity with the wavelength 257 nm at the surface of the low-reflective layer 15 (TaONH film) was 6.2% which was 15% or less. The contrast was obtained based on these results and the above-mentioned formula, and the contrast with respect to the wavelength of 257 nm was 79.9%.

With respect to the wavelength of mask pattern inspection light, the contrast between the surface of the protection layer 13 and the surface of the low-reflective layer 15 was 70% or more which was a sufficient result of contrast.

On the obtained EUV mask blank 1, the reflectivity of EUV light is measured by irradiating EUV light (wavelength 13.5 nm) to the surface of the low-reflective layer 15 (TaONH film). As a result, the reflectivity of EUV light is 0.4%.

(5) Evaluation of Reflection Characteristics (Wavelength: 400 to 1,200 nm)

The reflectivity with respect to a wavelength of from 400 to 1,200 nm at the surface of the low-reflective layer 15 (TaONH film) was measured with a spectrophotometer (HITACHI, UV-4100). Values of reflectivity with respect to predetermined wavelengths were as follows.
[Target Value]
  405 nm: <40%
  600 to 650 nm: 30 to 50%
  800 to 900 nm: >50%
  1,000 to 1,200 nm: <90%
[Result of Measurement]
  405 nm: 27%

600 to 650 nm: 44 to 46%
800 to 900 nm: 51 to 55%
1,000 to 1,200 nm: <65%
Any wavelength showed values of reflectivity in the range of target value.

Example 2

In this Example, the same procedure as Example 1 is carried out except that the low-reflective layer 15 is of TaOH, to thereby form an EUV mask blank 1 wherein the reflective layer 12, the protection layer 13, the absorbing layer 14 (TaNH) and the low-reflective layer 15 (TaOH) are deposited in this order on the substrate 11. The composition ratio (at %) of the low-reflective layer 15 (TaOH) is measured in the same manner as Example 1 to obtain Ta:O:H=30:61:9.

The conditions of depositing the low-reflective layer 15 (TaOH) are as follows.
Conditions of Depositing Low-Reflective Layer 15 (TaOH Film)
  Target: Ta target
  Sputtering gas: a gas mixture of Ar, $O_2$ and $H_2$ (Ar: 60 vol %, $O_2$: 37.3 vol %, $H_2$: 2.7 vol %, gas pressure: 0.3 Pa)
  Applied power: 450 W
  Film deposition rate: 2.0 nm/sec
  Film thickness: 10 nm The crystalline state of the low-reflective layer 15 (TaOH film) obtained according to the above-mentioned procedure is examined by the same procedure as Example 1, and it is verified that the crystalline state is of an amorphous structure or a microcrystalline structure.

The surface roughness (rms) of the low-reflective layer 15 (TaOH film) is examined in the same procedure as Example 1 to find 0.31 nm.

Then, the evaluation of the reflection characteristics of the EUV blank obtained according to the above-mentioned procedure is made in the same manner as Example 1. The reflectivity with respect to the wavelength 257 nm at the surface of the low-reflective layer 15 (TaOH film) is evaluated in the same manner as Example 1 to find 5.9% which satisfies the value of 15% or less. From these results, the contrast with the wavelength 257 nm is 80.9%.

The contrast with respect to the wavelength of mask pattern inspection light between the surface of the protection layer 13 and the surface of the low-reflective layer 15 is 70% or more which provides a sufficient contrast. By irradiating EUV light (wavelength: 13.5 nm) onto the surface of the low-reflective layer 15 (TaOH film) of the obtained EUV mask blank 1, the reflectivity of EUV light is measured. As a result, the reflectivity of EUV light is 0.5%.

Then, the reflectivity with respect to a wavelength of 400 to 1,200 nm at the surface of the low-reflective layer 15 (TaOH film) is evaluated in the same manner as Example 1. Values of reflectivity with respect to predetermined wavelengths are as follows.
  [Target Value]
  405 nm: <40%
  600 to 650 nm: 30 to 50%
  800 to 900 nm: >50%
  1,000 to 1,200 nm: <90%
  [Result of Measurement]
  405 nm: 31%
  600 to 650 nm: 42 to 45%
  800 to 900 nm: 51 to 56%
  1,000 to 1,200 nm: <65%

Any wavelength showed values of reflectivity in the range of target value.

Example 3

This Example is conducted in the same manner as Example 1 except that the absorbing layer 14 is of a TaN film. The composition ratio (at %) of the absorbing layer 14 (TaN) is measured in the same manner as Example 1 to obtain Ta:N=55:45. The O content of the absorbing layer is 0.05 at % or less.

The conditions of depositing the absorbing layer 14 (TaN) are as follows.
Conditions of Depositing TaN Layer
  Target: Ta target
  Sputtering gas: a gas mixture of Ar and $N_2$ (Ar: 86 vol %, $N_2$: 14 vol %, gas pressure: 0.37 Pa)
  Applied power: 300 W
  Film deposition rate: 1.1 nm/min
  Film thickness: 60 nm Then, on the absorbing layer 14, a low-reflective layer 15 (TaONH) is formed in the same manner as Example 1 to obtain an EUV mask blank wherein the reflective layer 12, the protection layer 13, the absorbing layer 14 (TaN) and the low-reflective layer 15 (TaONH) are formed in this order on the substrate 11.

The reflection characteristics of the EUV mask blank obtained according to the above-mentioned procedure are evaluated in the same manner as Example 1. The reflectivity with respect to the wavelength 257 nm at the surface of the low-reflective layer 15 (TaONH film) is evaluated in the same manner as Example 1 to obtain 6.0% which satisfies 15% or less. From these results, the contrast with the wavelength 257 nm is 80.6%.

The contrast with respect to the wavelength of mask pattern inspection light between the surface of the protection layer 13 and the surface of the low-reflective layer 15 is 70% or more which provides a sufficient contrast. By irradiating a EUV light (wavelength: 13.5 nm) onto the surface of the low-reflective layer 15 (TaONH film) of the obtained EUV mask blank 1, the reflectivity of EUV light is measured. As a result, the reflectivity of EUV light is 0.5%.

Then, the reflectivity with respect to a wavelength of 400 to 1,200 nm at the surface of the low-reflective layer 15 (TaONH film) is evaluated in the same manner as Example 1. Values of reflectivity with respect to predetermined wavelengths are as follows.
  [Target Value]
  405 nm: <40%
  600 to 650 nm: 30 to 50%
  800 to 900 nm: >50%
  1,000 to 1,200 nm: <90%
  [Result of Measurement]
  405 nm: 30%
  600 to 650 nm: 43 to 46%
  800 to 900 nm: 51 to 56%
  1,000 to 1,200 nm: <65%

Any wavelength showed values of reflectivity in the range of target value.

Example 4

This Example is conducted in the same manner as Example 2 except that the absorbing layer 14 is of a TaN film. The absorbing layer 14 (TaN film) is prepared in the same procedure as Example 3 to obtain an EUV mask blank 1 wherein the reflective layer 12, the protection layer 13, the absorbing layer 14 (TaN) and the low-reflective layer 15 (TaOH) are deposited in this order on the substrate 11.

On the EUV blank obtained according to the above-mentioned procedure, the reflection characteristics are evaluated in the same manner as Example 1. In the evaluation of the reflectivity with the wavelength 257 nm at the surface of the low-reflective layer 15 (TaOH film) in the same manner as Example 1, it shows 6.1% which satisfies 15% or less. From these results, the contrast with the wavelength 257 nm is 80.3%.

The contrast with respect to the wavelength of mask pattern inspection light between the surface of the protection layer 13 and the surface of the low-reflective layer 15 is 70% or more which provides a sufficient contrast. By irradiating a EUV light (wavelength: 13.5 nm) onto the surface of the low-reflective layer 15 (TaOH film) of the obtained EUV mask blank 1, the reflectivity of EUV light is measured. As a result, the reflectivity of EUV light is 0.4%.

Then, the reflectivity with respect to a wavelength of 400 to 1,200 nm at the surface of the low-reflective layer 15 (TaOH film) is evaluated in the same manner as Example 1. Values of reflectivity with respect to predetermined wavelengths are as follows.

[Target Value]
405 nm: <40%
600 to 650 nm: 30 to 50%
800 to 900 nm: >50%
1,000 to 1,200 nm: <90%
[Result of Measurement]
405 nm: 30%
600 to 650 nm: 42 to 46%
800 to 900 nm: 51 to 57%
1,000 to 1,200 nm: <65%

Any wavelength showed values of reflectivity in the range of target value.

Example 5

This Example is conducted in the same manner as Example 1 except that the absorbing layer 14 is of a TaBN film. The composition ratio (at %) of the absorbing layer 14 (TaBN) is measured in the same manner as Example 1 to obtain Ta:B:N=50:10:40. The O content of the absorbing layer is 0.05 at % or less.

The conditions of depositing the absorbing layer 14 (TaBN) are as follows.
Conditions of Depositing TaBN Layer
Target: TaB compound target (composition ratio: Ta 80 at %, B 20 at %)
Sputtering gas: a gas mixture of Ar and $N_2$ (Ar: 80 vol %, $N_2$: 20 vol %, gas pressure: 0.46 Pa)
Applied power: 300 W
Film deposition rate: 1.2 nm/min
Film thickness: 60 nm Then, on the absorbing layer 14, the low-reflective layer 15 (TaONH) is formed in the same manner as Example 1 to obtain an EUV mask blank 1 wherein the reflective layer 12, the protection layer 13, the absorbing layer 14 (TaBN) and the low-reflective layer 15 (TaONH) are formed in this order on the substrate 11.

The reflection characteristics of the EUV blank obtained according to the above-mentioned procedure are evaluated in the same manner as Example 1. The reflectivity with respect to the wavelength 257 nm at the surface of the low-reflective layer 15 (TaONH film) is evaluated in the same manner as Example 1 to obtain 6.3% which satisfies 15% or less. From these results, the contrast with the wavelength 257 nm is 79.7%.

The contrast with respect to the wavelength of mask pattern inspection light between the surface of the protection layer 13 and the surface of the low-reflective layer 15 is 70% or more which provides a sufficient contrast. By irradiating EUV light (wavelength: 13.5 nm) onto the surface of the low-reflective layer 15 (TaONH film) of the obtained EUV mask blank 1, the reflectivity of EUV light is measured. As a result, the reflectivity of EUV light is 0.5%.

Then, the reflectivity with respect to a wavelength of 400 to 1,200 nm at the surface of the low-reflective layer 15 (TaONH film) is evaluated in the same manner as Example 1. Values of reflectivity with respect to predetermined wavelengths are as follows.

[Target Value]
405 nm: <40%
600 to 650 nm: 30 to 50%
800 to 900 nm: >50%
1,000 to 1,200 nm: <90%
[Result of Measurement]
405 nm: 29%
600 to 650 nm: 42 to 46%
800 to 900 nm: 51 to 56%
1,000 to 1,200 nm: <65%

Any wavelength showed values of reflectivity in the range of target value.

Example 6

This Example is conducted in the same manner as Example 1 except that the absorbing layer 14 is of a TaBNH film. The composition ratio (at %) of the absorbing layer 14 (TaBNH) is measured in the same manner as Example 1 to obtain Ta:B:N:H=60:3:33:4. The O content of the absorbing layer is 0.05 at % or less.

The conditions of depositing the absorbing layer 14 (TaBNH) are as follows.
Conditions of Depositing TaBNH Layer
Target: TaB compound target (composition ratio: Ta 80 at %, B 20 at %)
Sputtering gas: a gas mixture of Ar and $N_2$ and $H_2$ (Ar: 80 vol %, $N_2$: 17.3 vol %, $H_2$: 2.7 vol %, gas pressure: 0.46 Pa)
Applied power: 300 W
Film deposition rate: 1.5 nm/min
Film thickness: 60 nm Then, on the absorbing layer 14, the low-reflective layer 15 (TaONH) is formed in the same manner as Example 1 to obtain an EUV mask blank 1 wherein the reflective layer 12, the protection layer 13, the absorbing layer 14 (TaBNH) and the low-reflective layer 15 (TaONH) are formed in this order on the substrate 11.

The reflection characteristics of the EUV blank obtained according to the above-mentioned procedure are evaluated in the same manner as Example 1. The reflectivity with respect to the wavelength 257 nm at the surface of the low-reflective layer 15 (TaONH film) is evaluated in the same manner as Example 1 to obtain 6.2% which satisfies 15% or less. From these results, the contrast with the wavelength 257 nm is 80.0%.

The contrast with respect to the wavelength of mask pattern inspection light between the surface of the protection layer 13 and the surface of the low-reflective layer 15 is 70% or more which provides a sufficient contrast. By irradiating EUV light (wavelength: 13.5 nm) onto the surface of the low-reflective layer 15 (TaONH film) of the obtained EUV mask blank 1, the reflectivity of EUV light is measured. As a result, the reflectivity of EUV light is 0.5%.

Then, the reflectivity with respect to a wavelength of 400 to 1,200 nm at the surface of the low-reflective layer 15 (TaONH film) is evaluated in the same manner as Example 1. Values of reflectivity with respect to predetermined wavelengths are as follows.

[Target Value]
405 nm: <40%
600 to 650 nm: 30 to 50%
800 to 900 nm: >50%
1,000 to 1,200 nm: <90%
[Result of Measurement]
405 nm: 31%
600 to 650 nm: 42 to 47%
800 to 900 nm: 51 to 55%
1,000 to 1,200 nm: <65%

Any wavelength showed values of reflectivity in the range of target value.

Comparative Example 1

This Comparative Example was conducted in the same procedure as Example 1 except that the low-reflective layer 15 was made of a TaON film which did not contain hydrogen (H) but contained tantalum (Ta), oxygen (O) and nitrogen (N). The composition ratio (at %) of the low-reflective layer 15 was measured in the same manner as Example 1. As a result, Ta:O:N=24:70:6.

Conditions of depositing the low-reflective layer 15 (TaON film) are as follows.
Conditions of Depositing Low-Reflective Layer 15 (TaON Film)
Target: Ta target
Sputtering gas: a gas mixture of Ar and $O_2$ and $N_2$ (Ar: 36 vol %, $O_2$: 50 vol %, $N_2$: 14 vol %, gas pressure: 0.3 Pa)
Applied power: 450 W
Film deposition rate: 1.1 nm/min
Film thickness: 10 nm The evaluation of the reflection characteristics of the low-reflective layer 15 (TaON film) of the EUV mask blank obtained according to the above-mentioned procedure was conducted in the same manner as Example 1.

The reflectivity with respect to the wavelength 257 nm at the surface of the low-reflective layer 15 (TaON film) was 9.0% which satisfies 15% or less. When the contrast was obtained based on these results and the above-mentioned formula, the contrast with the wavelength 257 nm was 72.3%.

The contrast with respect to wavelengths of mask pattern inspection light between the surface of the protection layer 13 and the surface of the low-reflective layer 15 was 70% or more which provided a sufficient contrast.

Values of reflectivity with respect to a wavelength of 400 to 1,200 nm at the surface of the low-reflective layer 15 (TaON film) were as follows.

[Target Value]
405 nm: <40%
600 to 650 nm: 30 to 50%
800 to 900 nm: >50%
1,000 to 1,200 nm: <90%
[Result of Measurement]
405 nm: 31%
600 to 650 nm: 41 to 44%
800 to 900 nm: 49 to 53%
1,000 to 1,200 nm: <65%

A sufficient reflectivity could not be obtained with respect to a wavelength of 800 to 900 nm.

Industrial Applicability

The mask blank of the present invention can be utilized for producing a semiconductor integrated circuit by a photolithography method with EUV light as an exposure light source.

The entire disclosure of Japanese Patent Application No. 2008-279899 filed on Oct. 30, 2008 including specification, claims, drawings and summary is incorporated herein by reference in its entirety.

Reference Symbols
1: EUV mask blank
11: Substrate
12: Reflective layer (multilayered reflective film)
13: Protection layer
14: Absorbing layer
15: Low-reflective layer

What is claimed is:
1. A reflective mask blank for EUV lithography, comprising:
a substrate;
a reflective layer which reflects EUV light;
an absorbing layer which absorbs EUV light; and
a low-reflective layer with respect to a mask pattern inspection light in a range of 190 nm to 260 nm,
wherein the reflective layer, absorbing layer and the low-reflective layer are formed over the substrate in an order of the reflective layer, the absorbing layer and the low-reflective layer, the low-reflective layer comprises Ta, O and H, and the low-reflective layer has a total content of Ta and O in a range between 85 and 99. 9 at % and a hydrogen content in a range between 0.1 and 15 at %.

2. The reflective mask blank for EUV lithography according to claim 1, wherein the low-reflective layer has a Ta:O composition ratio in a range between 1:8 and 3:1.

3. The reflective mask blank for EUV lithography according to claim 1, wherein the surface roughness of the low-reflective layer is 0.5 nm or less.

4. The reflective mask blank for EUV lithography according to claim 1, wherein the low-reflective layer has an amorphous surface structure.

5. The reflective mask blank for EUV lithography according to claim 1, wherein the low-reflective layer has a film thickness in a range between 3 and 30 nm.

6. The reflective mask blank for EUV lithography according to claim 1, wherein the absorbing layer comprises Ta as a main component.

7. The reflective mask blank for EUV lithography according to claim 1, wherein the absorbing layer comprises Ta as a main component and at least one element selected from the group consisting of Hf, Si, Zr, Ge, B, N and H.

8. The reflective mask blank for EUV lithography according to claim 1, wherein the absorbing layer has an oxygen content of less than 25 at %.

9. The reflective mask blank for EUV lithography according to claim 1, wherein the absorbing layer and the low-reflective layer have a total film thickness in a range between 30 and 200 nm.

10. The reflective mask blank for EUV lithography according to claim 1, further comprising a protection layer formed between the reflective layer and the absorbing layer such that the protection layer protects the reflective layer at the time of forming a pattern in the absorbing layer, wherein with respect to the mask pattern inspection light, the protection layer and the low-reflective layer have a contrast of the reflection light at a surface of the protection layer with the reflection light at a surface of the low-reflective layer which is 60% or more.

11. The reflective mask blank for EUV lithography according to claim 1, wherein the hydrogen content of the low-reflective layer is at least 1 at % higher than a hydrogen content of the absorbing layer.

12. The reflective mask blank for EUV lithography according to claim 1, wherein with respect to the mask pattern inspection light, the low-reflective layer has a reflectivity at a surface of the low-reflective layer which is 15% or less.

13. The reflective mask blank for EUV lithography according to claim 1, wherein the low-reflective layer is formed by sputtering a Ta target in an atmosphere comprising O, H and at least one inert gas selected from the group consisting of He, Ar, Ne, Kr and Xe.

14. A reflective mask for EUV lithography, produced by a process comprising patterning the absorbing layer and the low-reflective layer of a reflective mask blank for EUV lithography according to claim 1.

15. A method for producing a semiconductor integrated circuit, comprising:
exposing light to a substrate with a reflective mask for EUV lithography according to claim 14.

16. A reflective mask blank for EUV lithography, comprising:
a substrate;
a reflective layer which reflects EUV light;
an absorbing layer which absorbs EUV light; and
a low-reflective layer with respect to a mask pattern inspection light having a wavelength in a range of 190 nm to 260 nm,
wherein the reflective layer, the absorbing layer and the low-reflective layer are formed over the substrate in an order of the reflective layer, the absorbing layer and the low-reflective layer, the low-reflective layer comprises Ta, O, N and H, and the low-reflective layer has a total content of Ta, O and N in a range between 85 and 99.9 at % and a hydrogen content in a range between 0.1 and 15 at %.

17. The reflective mask blank for EUV lithography according to claim 16, wherein the low-reflective layer has a Ta:(O+N) composition ratio in a range of 1:8 to 3:1.

18. The reflective mask blank for EUV lithography according to claim 16, wherein the surface roughness of the low-reflective layer is 0.5 nm or less.

19. The reflective mask blank for EUV lithography according to claim 16, wherein the low-reflective layer has an amorphous surface structure.

20. The reflective mask blank for EUV lithography according to claim 16, wherein the low-reflective layer has a film thickness which is between 3 and 30 nm.

21. The reflective mask blank for EUV lithography according to claim 16, wherein the absorbing layer comprises Ta as a main component.

22. The reflective mask blank for EUV lithography according to claim 16, wherein the absorbing layer comprises Ta as a main component and at least one element selected from the group consisting of Hf, Si, Zr, Ge, B, N and H.

23. The reflective mask blank for EUV lithography according to claim 16, wherein the absorbing layer has an oxygen content of less than 25 at %.

24. The reflective mask blank for EUV lithography according to claim 16, wherein the absorbing layer and the low-reflective layer have a total film thickness in a range between 30 and 200 nm.

25. The reflective mask blank for EUV lithography according to claim 16, further comprising a protection layer formed between the reflective layer and the absorbing layer such that the protection layer protects the reflective layer at the time of forming a pattern in the absorbing layer, wherein with respect to the mask pattern inspection light, the protection layer and the low-reflective layer have a contrast of the reflection light at a surface of the protection layer with the reflection light at a surface of the low-reflective layer which is 60% or more.

26. The reflective mask blank for EUV lithography according to claim 16, wherein the hydrogen content of the low-reflective layer is at least 1 at % higher than a hydrogen content of the absorbing layer.

27. The reflective mask blank for EUV lithography according to claim 16, wherein with respect to the mask pattern inspection light, the low-reflective layer has a reflectivity at a surface of the low-reflective layer which is 15% or less.

28. The reflective mask blank for EUV lithography according to claim 16, wherein the low-reflective layer is formed by sputtering a Ta target in an atmosphere comprising O, N, H and at least one inert gas selected from the group consisting of He, Ar, Ne, Kr and Xe.

29. A reflective mask for EUV lithography, produced by a process comprising patterning the absorbing layer and the low-reflective layer of a reflective mask blank for EUV lithography according to claim 16.

30. A method for producing a semiconductor integrated circuit, comprising:
exposing light to a substrate with a reflective mask for EUV lithography according to claim 29.

31. A method for producing a reflective mask blank for EUV lithography, comprising:
forming over a substrate a reflective layer which reflects EUV light, an absorbing layer which absorbs EUV light and a low-reflective layer with respect to a mask pattern inspection light having a wavelength in a range of 190 nm to 260 nm in an order of the reflective layer, the absorbing layer and the low-reflective layer,
wherein the forming of the low-reflective layer comprises sputtering a Ta target in an atmosphere comprising O, H and at least one inert gas selected from the group consisting of He, Ar, Ne, Kr and Xe.

32. A method for producing a reflective mask blank for EUV lithography, comprising:
forming over a substrate a reflective layer which reflects EUV light, an absorbing layer which absorbs EUV light and a low-reflective layer with respect to a mask pattern inspection light having a wavelength in a range of 190 nm to 260 nm in an order of the reflective layer, the absorbing layer and the low-reflective layer,
wherein the forming of the low-reflective layer comprises sputtering a Ta target in an atmosphere comprising O, N, H and at least one inert gas selected from the group consisting of He, Ar, Ne, Kr and Xe.

* * * * *